United States Patent [19]

Heller et al.

[11] 4,020,880
[45] May 3, 1977

[54] APPARATUS AND METHOD FOR SHAPING AND CUTTING INTEGRATED CIRCUIT COMPONENTS

[75] Inventors: Martin G. Heller, Short Hills; Richard L. Cheney, Lake Hiawatha; Karl H. Kautzmann, Westfield, all of N.J.

[73] Assignee: Martin G. Heller, Short Hills, N.J.

[22] Filed: Aug. 19, 1976

[21] Appl. No.: 715,869

[52] U.S. Cl. .............................. 140/140; 140/105; 29/593
[51] Int. Cl.² ......................................... B21F 1/02
[58] Field of Search ............. 140/1, 105, 140, 147; 29/593; 72/332, DIG. 10

[56] References Cited
UNITED STATES PATENTS

| | | | |
|---|---|---|---|
| 3,144,889 | 8/1964 | Cole .................... | 140/140 |
| 3,687,172 | 8/1972 | Suverkropp .............. | 140/147 |
| 3,857,420 | 12/1974 | Newman ................. | 140/140 |
| 3,880,205 | 4/1975 | Linker et al. .......... | 140/147 |

Primary Examiner—Lowell A. Larson

Attorney, Agent, or Firm—Ralph R. Roberts

[57] ABSTRACT

The present apparatus provides for the automatic shaping and/or cutting of the leads of integrated circuit components which are intermittently advanced to and through a straightening and cutting portion of the apparatus. A base plate is disposed at an angle of approximately 40° to the horizontal and provides a base for the gravitational feeding of integrated circuit components carried in plastic guides both before and after trimming. The untrimmed components are fed by gravity to a metering station whereat a rubber roller is intermittently rotated so that each component is brought in way of a pair of opposed processing blades. These blades are simultaneously advanced by eccentric means which are moved in strict timed relationship to the movement of the component in way of the processing blades. As cutoff blades they cooperate with a center guide die to provide the desired shearing action. Both blades and die may be sharpened several times without losing the desired registration. By changing advance or rotation of the rubber wheel the length of the component to be accommodated is changed.

19 Claims, 9 Drawing Figures

APPARATUS AND METHOD FOR SHAPING AND CUTTING INTEGRATED CIRCUIT COMPONENTS

BACKGROUND OF THE INVENTION

1. Field of the Invention

With reference to the classification of art as established in the United States Patent and Trademark Office the present invention is believed to be found in the Class generally identified as "Wire Working" (Class 140) and in the subclass of "combined machines" (subclass 1) and also in the subclass entitled, "wire cutting and straightening predetermined lengths" (subclass 140). The present invention may also be found in the Class identified as "Metal Deforming" and the subclass thereunder entitled, "with cutting by shearing and tool couple" (subclass 332).

2. Description of the Prior Art

For ease of identification, hereinafter "IC" will be used to indicate "Integrated Circuit Components". This is a well known and accepted abbreviation and is, therefore, used to clarify and keep the length of the specification and claims as short as practical.

The cutting and straightening of leads in commercially used electronic circuits are usually produced by special equipment designed and built for a particular IC and for a particular length of lead. This is a high volume apparatus but does not include adjustability permitting ready and rapid change from one component size and lead length to another component size and/or lead length.

The use of dies to cut IC's to predetermined length and also for straightening has been well defined. The leads extending from the body portion of commercially produced components often have to be cut to a precise length. The apparatus of this invention provides for a particular straightening and/or shearing to a length of the lead of an IC. In the present apparatus adjustability is provided whereby IC's of various types may be accommodated. This contemplates that any change in the IC or lead treatment will require and receive a minimum of apparatus change. The IC's may have three, four or more leads per side and may be straightened and/or cut to a determined length. The adjustability of this apparatus is provided by a change in the degree or amount of rotation of a feeding wheel necessary to advance one IC component to a determined position in a cutoff station. The guide for the untrimmed IC's and the trimmed components is made merely to accommodate the apart spacing of the IC leads and also the sheared cutting of the IC leads to the desired length. This is easily accommodated with a very ready change in the guides provided with this apparatus. This apparatus, although essentially gravitational, utilizes a rubber tire or rubber feeding wheel to insure that the IC's are brought to a determined position in the cutting station and that a straightening, if required, and a cutting of the leads are accommodated at a particular time and position in the apparatus.

SUMMARY OF THE INVENTION

This invention may be summarized at least in part with reference to its objects.

It is an object of this invention to provide, and it does provide, gravitational feeding of IC components while still in their plastic U-shaped guide retainers and to advance these components by means of an intermittent feed to and through a straightening, testing and/or cutting device and after the leads have been processed the components are released for gravitational accumulation in the like U-shaped plastic guide retainers.

It is a further object of this invention to provide, and it does provide, an adjustable gate feed whereby a rubber wheel is intermittently rotated and engages and feeds an IC component to a predetermined position whereby the leads are shaped, tested and/or cut to a determined length. The residue of the cut leads is discharged and the now processed or trimmed IC components are released to slide by gravitational force into a determined position in the plastic U-shaped guide retainers.

In essence, this invention contemplates a gravitational feed whereby the IC components are and as carried in a U-shaped plastic guide retainer advanced from this retainer into straightening, testing and/or cutting stations. This gravitational advance is metered and controlled by means of an intermittently rotated rubber wheel which engages the IC components on their top surfaces and advances these components to a testing, straightening and/or cutting off station. If a cut off of the leads is to be actuated, eccentrically operated cutting blades are advanced in a timed relationship to the intermittent rotation of the wheel to shear the leads at a determined length. After the cutting operation has been performed the cutting blades are withdrawn and the now trimmed IC's are released to a plastic U-shaped guide container wherein the several IC's are accumulated.

In addition to the above summary the following disclosure is detailed to insure adequacy and aid in understanding of the invention. This disclosure, however, is not intended to cover each new inventive concept therein no matter how it may later be disguised by variations in form or additions of further improvements. For this reason there has been chosen a specific embodiment of the apparatus for shaping and/or cutting the leads of integrated circuit components as adopted for use with easily sharpened cutter blades and dies and showing a preferred means for ready adjustment for component change. This specific embodiment has been chosen for the purposes of illustration and description as shown in the accompanying drawings wherein:

Figure 1:
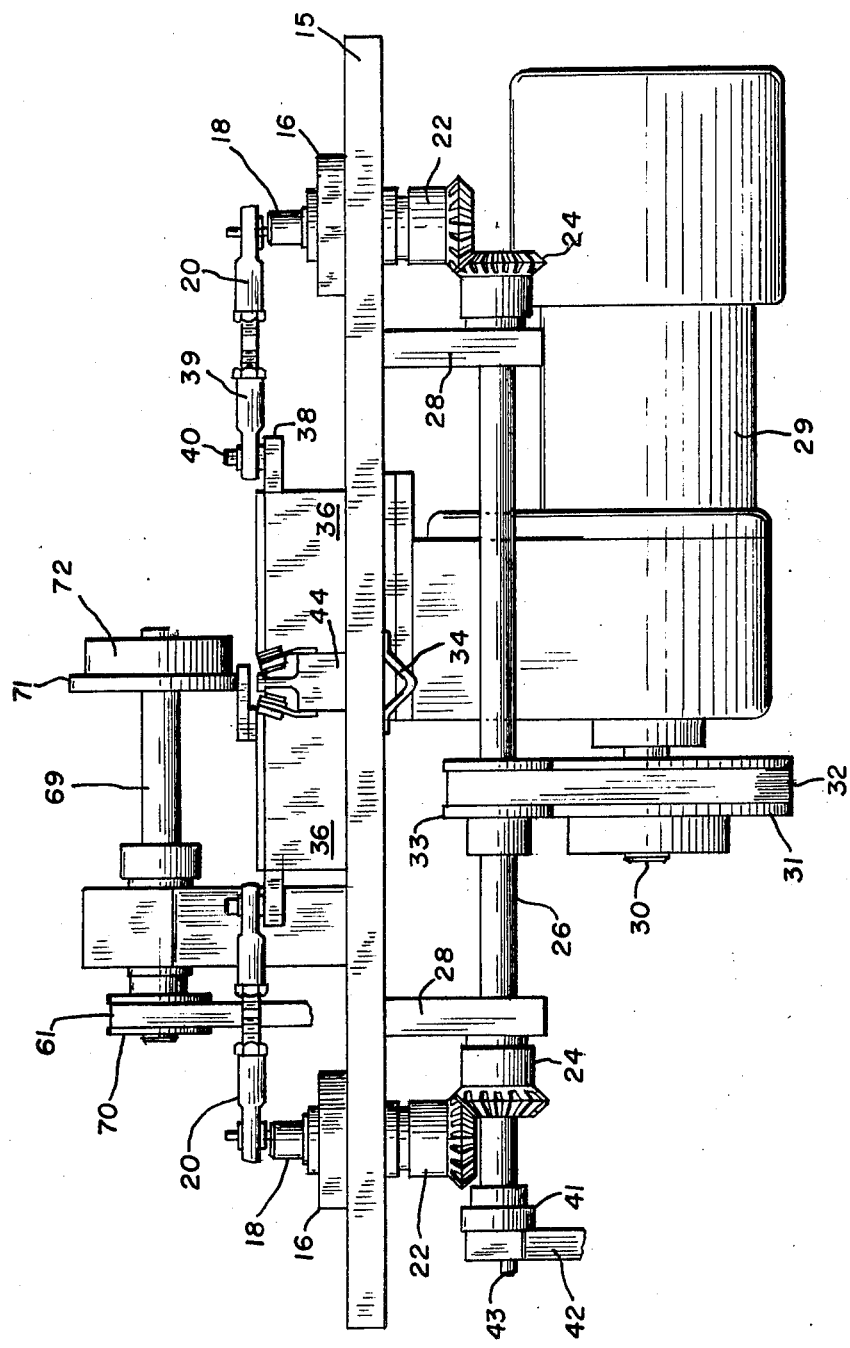
FIG. 1 represents a front view, partly diagrammatic, of a cutting and straightening apparatus of the leads for IC modules.

In the following description and in the claims various details are identified by specific means for convenience, these names, however, are intended to be generic in their application. Corresponding reference characters refer to like members throughout the several figures of the drawings. The drawings accompanying this specification disclose certain details of construction for the purpose of explanation but it should be understood that structural details may be modified in various respects and that the invention may be incorporated in other structural forms than shown.

Description of the Preferred Embodiment

Figure 2:
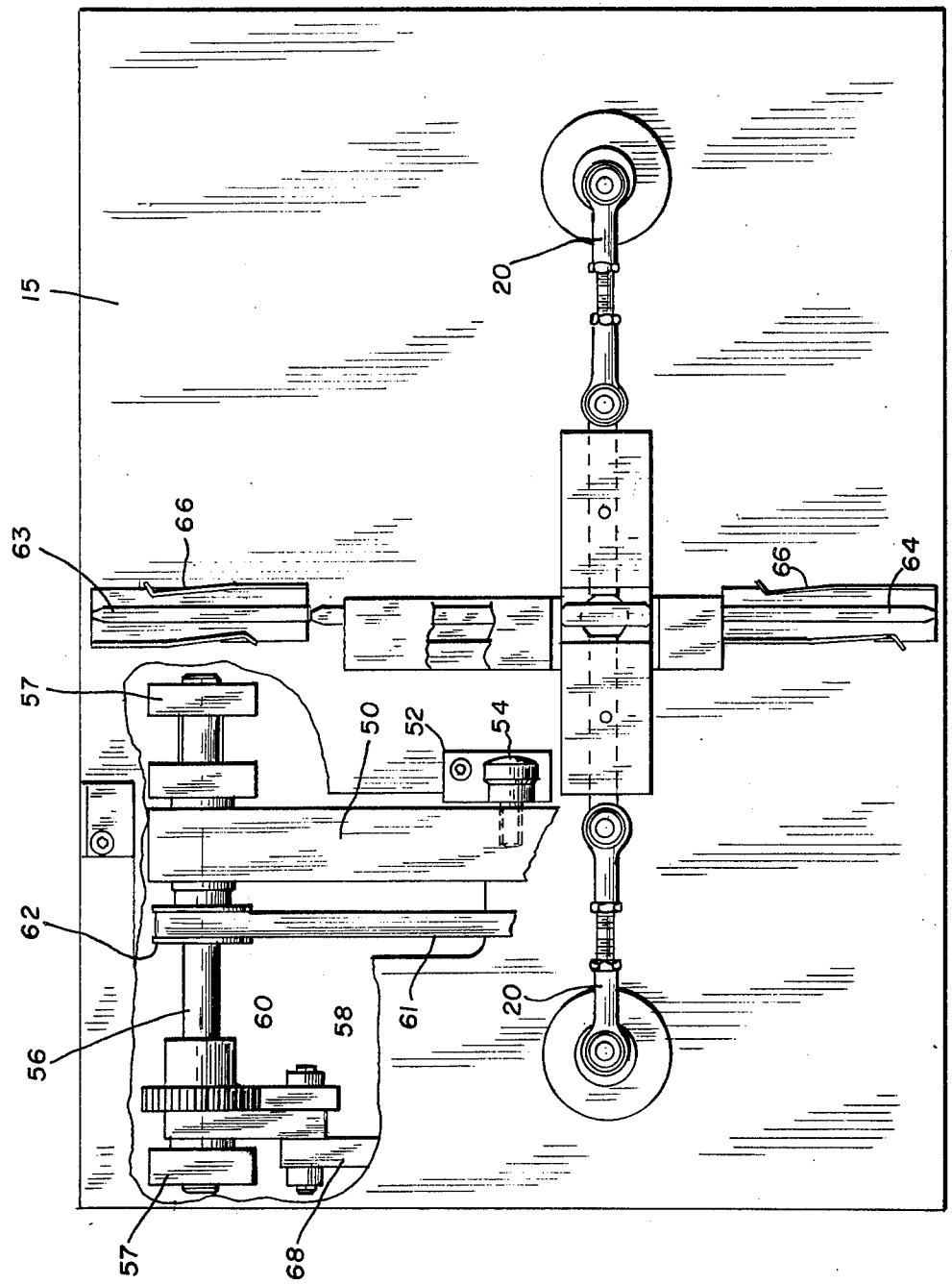
FIG. 2 represents a plan view of the apparatus of FIG. 1, this view having a portion broken away to show the underdrive apparatus of the IC module advancing mechanism.

Referring now in particular to FIGS. 1 and 2 there is shown a base plate 15 which is carried by means not shown. Attached at fixed positions on this base plate 15 are post or flange bearings 16 which are positioned above through holes formed in this plate. Carried in these post or flange bearings 16 are shafts 18 whose upper ends are either eccentrically drilled or eccentrically shaped to receive and retain a rod end 20. These rod ends are preferably of an antifriction type and may be secured either by a cap screw, a pin or by a reduced end portion of the shaft 18. The eccentric movement produced is a predetermined amount, for example, about one-eighth of an inch to give one-quarter of an inch movement of a testing block, a straightening die or a cut off blade moved by this eccentric. On the lower end of this shaft 18 are carried bevel gears 22 which are driven by like bevel gears 24 carried on shaft 26. Shaft 26 is carried in and by pillow blocks 28 which are attached to the underside of the base plate 15. Motor 29 may be a gear motor with its output shaft 30 turning at a slow speed. This output shaft carries a timing belt pulley 31 which drives a timing belt 32. Pulley 33 is carried by and on shaft 26 and is driven by timing belt 32. Also seen on the underside of this apparatus, in FIG. 1, is a residue chute 34 disposed to carry the clippings from the leads of the IC's.

Carried on the upper portion of this base plate 15 are processing member guides 36 which, as shown, are cut off knives 38. These knives are connected to rod ends 39 which are secured to the cutter bars 38 by means of screws 40. On the outboard end of shaft 26 is carried an eccentric pad 41 on which is secured arm 42 by means of screw 43. For adjustment a T-slot is formed in pad 41 and the screw 43 is carried and tightened in this slot to provide the desired amount of eccentric movement or throw. The actuation of this arm will be more fully described in conjunction with FIG. 3. A support 44 is placed between the knife supports 36 and as a pedestal portion carries on its upper end an upper guide and die end 46.

As particularly seen in FIG. 2, a precise metering feed through the processing station includes an arm 50 which at its midlength is carried by a bracket 52. This arm, after adjustment, it tightened in position to the bracket by means of knob 54. This arm 50 is pivotally carried on a shaft 56 rotatably carried in bearing pedestals 57. This shaft is intermittently driven by a pawl 58 and a ratchet gear 60 carried on shaft 56. The intermittent motion of this shaft produced by this pawl and ratchet is transmitted by means of timing belt 61 and the timing belt pulley 62 carried on shaft 56.

Also to be noted in FIG. 2 is IC guide receiving members 63 and 64 which are disposed to receive the plastic retainers in which the IC's are shipped. The upper guide 63 is disposed to receive the untrimmed and/or unstraightened IC's and the lower guide 64 is disposed to receive the IC's after they have been straightened and/or cut to the proper length. Spring fingers 66 are disposed to engage the sides of these U-shaped plastic retainers in order to retain them in position during the feeding and receiving of the IC's.

Figure 3:
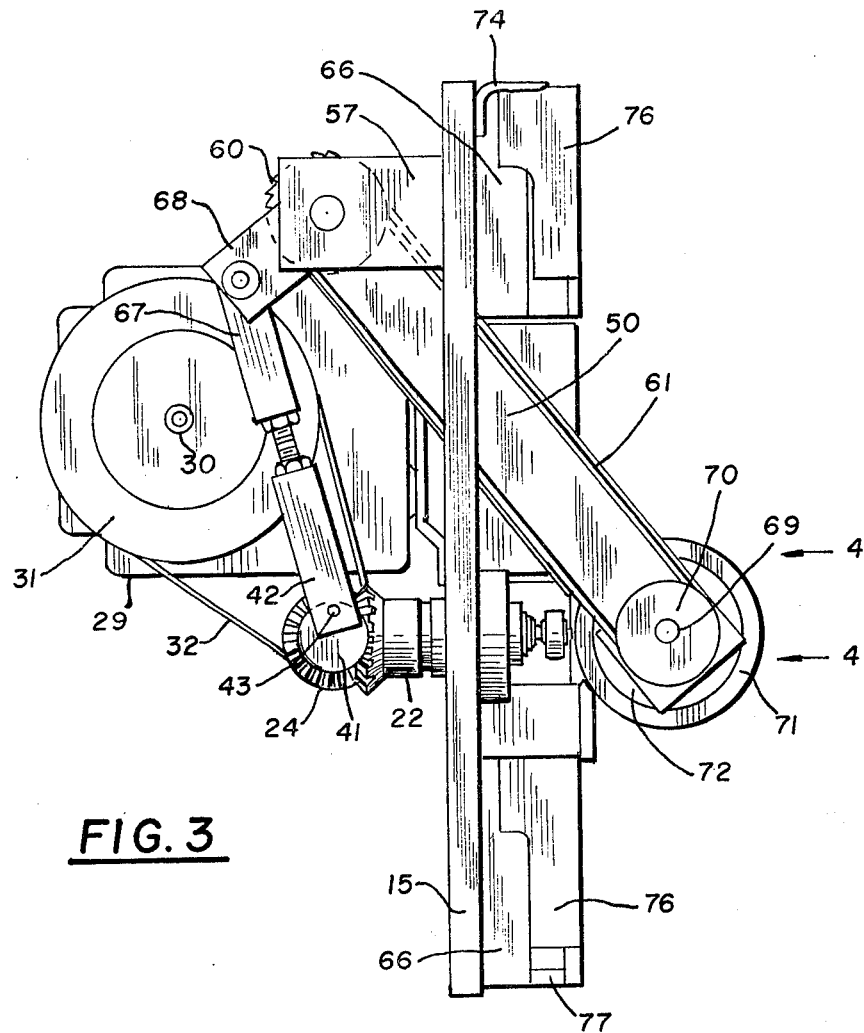
FIG. 3 represents a side view, partly diagrammatic, showing the drive apparatus for instantly and intermittently advancing and releasing the integrated circuit assemblies and in this view showing the base plate in full plan rather than at the approximately forty degree tilt which is provided to gravitationally feed the IC components from their initial storage to receiving containers.

Intermittent Drive as Seen in FIG. 3

Referring now and in particular to FIG. 3, it is to be noted that pad member 41 carried on shaft 26 eccentrically moves screw or pin 43 and pivotally retained arm 42 in a reciprocating manner. This pitman arm 42 is adjustably secured to arm member 67 which moves pivoted member 68 and pawl 58 (FIG. 2) carried thereon and thereby. Ratchet gear 60 is driven by this pawl 58 and moves timing belt 61. In a like manner upper shaft 69 is driven by belt 61 through timing belt gear 70 which is carried on the end of this upper shaft 69. On the opposite end of this shaft 69 is carried a resilient, preferably rubber drive wheel 71 which is supported by flange 72 carried at the end of shaft 69.

Also seen in FIG. 3 are the spring fingers 66 which engage the sides of the plastic carriers of the IC components. To properly position the plastic guide with relation to the untrimmed components, the upper end guide includes a curved stop 74 which engages the upper end of a plastic carrier 76, as seen in FIG. 3. After the IC components have been tested, straightened and/or trimmed in the processing station, they are received in similar light, plastic carriers 76. A lower stop 77 insures that the plastic guide carrier is precisely positioned and that the IC components are not lost from the positioned carrier member 76.

Figure 4:
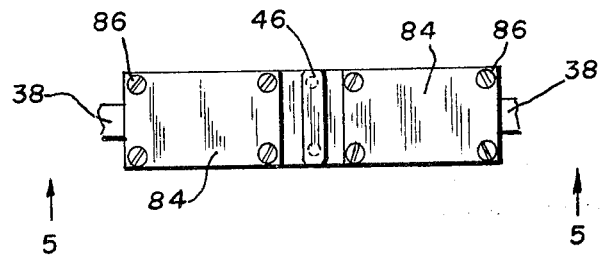
FIG. 4 represents a fragmentary plan view showing two cover plates and a center guide and die for the lead cutting apparatus of this apparatus.
Figure 5:
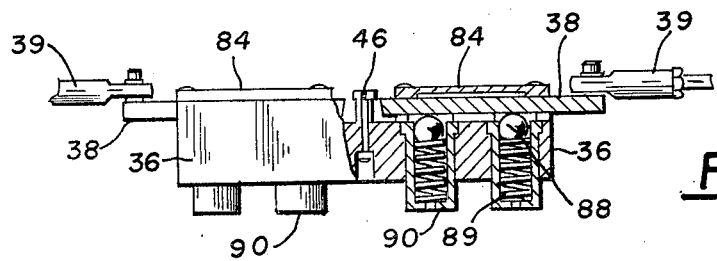
FIG. 5 represents a fragmentary and partly sectional view showing the cutting dies and in particular the method of holding the guide and processing dies in a proper relationship so that sharpening of the die guide and reciprocating process members is easily accomplished with a replacing always at the same precise height.
Figure 6:
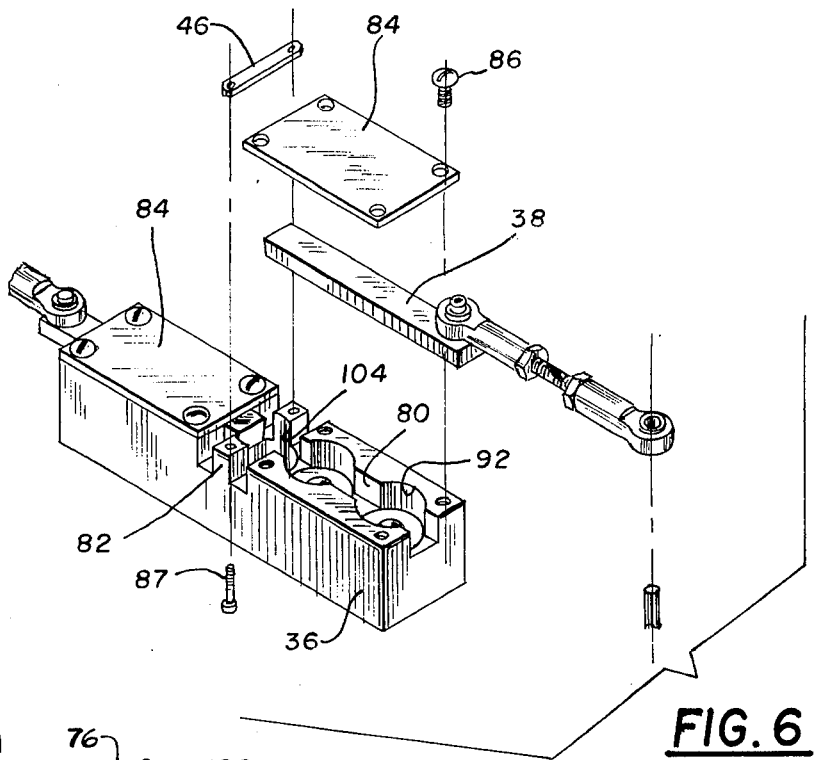
FIG. 6 represents an exploded, isometric view showing the preferred relationship of the various components forming a cutting station and the die portion of this apparatus.

Processing Station as in FIGS. 4, 5 and 6

As seen in FIGS. 4, 5 and 6, the guide blocks 36 are formed with a cutter bar 38 carried in a slot 80 in which the reciprocated processing member is slidably carried. The upper and center guide and die 46 is carried by pedestal portions 82 and when a cutter bar member 38 is to be provided it is retained in position by means of guide plate 84 and is secured in place by cap screws 86. Screws 87 extend through pedestal portions 82 to engage threaded portions in center guide cutting member 46. When tightened these bolts hold member 46 in position on pedestal portions 82. As particularly seen in FIG. 5, the assembly of the processing station shows that the cutter bars 38, when used, are urged into their upward and retained reciprocated position by means of balls 88 which are urged upwardly and maintained in this position by means of springs 89 which are carried in sring retainers 90 provided in apertures 92 formed in guide member 36.

Figure 7:
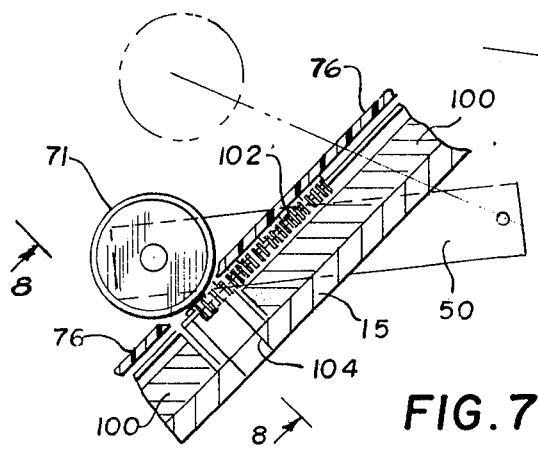
FIG. 7 represents a fragmentary, side view showing the normal inclination of the base plate and the IC components as they are brought to and in way of an intermittently advanced resilient wheel.

As seen particularly in FIG. 5, it is to be noted that a pair of springs 89 urge balls 88 upwardly to push the cutter bar 38 into a sliding condition against the underside of the plate 84. This plate 84 engages and positions the top surface of the cutting bar 38 so that the cutting bar may be sharpened several times by grinding on the top surface. The springs and the balls urge the bars upward to the established cutting position. At the same time, the undersurface of the upper guide and die 46, which acts as the other shear surface for the cutting of the leads, may be sharpened by grinding on this undersurface. This sharpening may be performed two or three times before the desired thickness of the upper guide bar 46 is sufficiently changed to affect the length of the leads of the IC's. After three or four grinding operations to sharpen bar 46, the bar becomes weak and tends to bow and cause cutting to be subject to burrs. Appropriate shims placed on the top of the guide 46 may be used to raise the support surface to provide a proper desired sliding surface for the underside of the IC's as they are advanced and the leads are cut or straightened. In FIG. 7 it is to be seen that the guides 100 are secured to the base 15 to provide a precise guide for the IC's 102 both before and after they have been tested, straightened and/or cut.

Use and Operation

Figure 8:
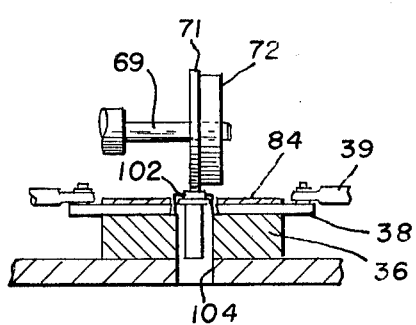
FIG. 8 represents a fragmentary sectional view taken on the line 8—8 of FIG. 7 and showing a lead die cutter member and an associated guide member prior to their advancing to the cut off position.
Figure 9:
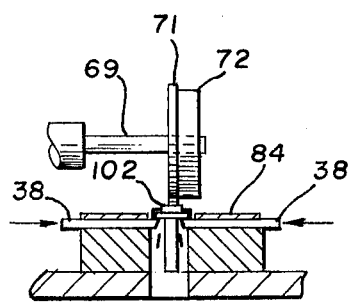
FIG. 9 represents the sectional view of FIG. 8 taken on the line 9—9 of FIG. 7 and showing the cutter members as they are brought to and past the guide die to shear the leads of the IC components.

As seen in FIGS. 7, 8 and 9, the IC's 102 have like plural leads on each side of their main body portions. These leads extend downwardly as they are carried in U-shaped, plastic carriers 63 and 64. These IC leads, as shown in FIGS. 7, 8 and 9, are shown as being cut to a determined length. The cutting bar members 38 are in the open condition and the IC's are advanced to a held position by the roller 71, as seen in FIGS. 7 and 8. In FIG. 8, the cutting bars 38 are drawn outwardly to their outer limit to allow the IC's to be advanced to the held position by the rubber advancing roller 71. Held in this position the eccentrics are moved inwardly to similarly move cutter bars 38 to shear the leads, as seen in FIG. 9, with the leads falling through the discharge hole 104 formed in the member 36 and in the base plate 15.

The embodiment shown has the processing members 38 and the guide bar 46 as performing a cutting of the leads of the IC's. Since this is the usual requirement for processing leads of IC's, this has been illustrated. It is also to be noted that the processing members 38 and guide member 46 may be shaped and sized to straighten leads and on occasion to provide contact ends for electrical circuits by which electrical checks of the IC's may be made.

It is also contemplated to provide a processing station whereat a combination cutting and straightening is provided by and with the processing members and the guide member. Both a straightening and cutting member and/or testing member may be actuated by a single eccentric member. As timed pairs and in combination with appropriate center guides, a precise feeding of the IC components by the resilient wheel 71, as it intermittently advances the body of the IC through the processing station, allows the timed cooperative movement of the eccentrically moved processing members to precisely act on the leads of the IC. The ready degree of change in the rotative motion of the wheel 71 and a replacement change in the cutting, shaping or testing member at the processing station enables the present invention to provide the rapid change needed with short run processing used to produce the various electrical assembly of components today.

The above description has shown the cutting bars 38 as a preferred embodiment and with these bars the balls 88 and springs 89 are used to urged the bar 38 against the under side of plate 84. This is not to preclude the use of alternate means such as leaf springs with lower contact plates which may be oil impregnated bronze or plastic such as Teflon (TM duPont). The present illustrated design allows ready replacement and sharpening of cutter bars 38 and with this in mind alternate constructions should be of like arrangement.

It is also to be noted that the intermittent drive which is initiated by the pitman arm 42 can be and often is a fixed amount since most IC bodies to be processed by a particular apparatus are substantially the same or very similar in size. Whether fixed or adjustable, the ratchet and pawl drive is moved in a precise timed relationship to the reciprocation of the bars 38.

Whether the bars 38 are cutting bars, straightening bars and dies or test bars is merely a matter of preference. If the IC leads are to be shaped and cut then the members 38 will have an appropriate form and lost motion. Where and when testing is to be achieved there is appropriate electrical signal means and also insulation of the contacting members. Usually the electrical contacts are provided on the guide die or member 46. The leads may be pressed into conductive contact by moving bars 38 which have their front faces formed with insulation. The test procedure is determined by the particular character of the IC component.

For the purpose of definition in the following claims the upper and lower guides and carriers are the guide receiving members 63 and 64. The slide guide in the processing station is the guide and die 46.

It is to be noted that this apparatus also provides a method for processing the leads of like IC components which includes gravitational feeding of like components to a processing station whereat after processing an accumulation by gravity is provided in a collecting carrier, said method including the steps of: providing and arranging a base and an upper receiving guide and carrier on said base so as to receive and retain a carrier in which a multiplicity of like-sized IC components are slidably retained for delivery from the lower end of the carrier and disposing said base and carrier at such an angle to the horizontal that the components in the carrier when mounted on the guide and carrier are delivered by gravity to said lower end of the carrier; positioning a slide guide at the lower discharge end of this carrier and guide and adapting this slide guide to receive the gravitationally delivered IC components; providing a processing station carried by the base and including the slide guide and positioning a resilient wheel which is carried by an arm pivotally mounted on the base so that this wheel is retained with the periphery of the resilient wheel engaging the body of an IC component when delivered to the slide guide; intermittently rotating this resilient wheel by a ratchet and pawl actuated by a pitman arm and moving this arm by motor means; reciprocably moving a pair of opposed processing members in a timed relationship to the movement of the resilient wheel, each opposed processing member disposed to move to and from the slide guide when and while an IC component is held in position by the intermittently rotated resilient wheel, each opposed processing member carried in a slide guide support carried by the base, and carrying a lower receiving guide and carrier on the base so that said carrier is positioned to accept and receive the multiplicity of like-sized processed IC components after they are processed at the processing station.

Terms such as "left", "right", "up", "down", "bottom", "top", "front", "back", "in", "out" and the like are applicable to the embodiment shown and described in conjunction with the drawings. These terms are merely for the purpose of description and do not necessarily apply to the position in which the apparatus and the associated processing components may be constructed or used.

While a particular embodiment of the IC processing apparatus has been shown and described it is to be understood the invention is not limited thereto since modifications may be made within the scope of the accompanying claims and protection is sought to the broadest extent the prior art allows.

What is claimed is:

1. Apparatus for processing the leads of like IC components which include gravitational feeding of these components to a processing station whereat after processing, an accumulation by gravity is provided in a collecting carrier, said apparatus including: (a) a base; (b) an upper receiving guide and carrier mounted on the base and adapted to accept and receive an IC carrier in which a multiplicity of like-sized IC components are slidably retained for delivery from the lower end of the IC carrier, said guide and carrier disposed at such an angle to the horizontal that the IC components in the carrier when mounted on this guide and carrier are delivered by gravity to said lower end of the upper guide and carrier; (c) a slide guide at the lower discharge end of the upper guide and carrier, and adapted to receive the gravitationally delivered IC components; (d) a processing station carried by the base and including the slide guide and a resilient wheel carried by an arm pivotally mounted on the base, this wheel selectively movable to a position whereat it is retained with the periphery of the resilient wheel engaging the body of an IC component when delivered to the slide guide, this resilient wheel being intermittently moved by a ratchet and pawl apparatus actuated by a reciprocably moved pitman arm, this arm moved by a motor means; (e) a pair of opposed processing members reciprocably moved in timed relationship to the movement of the resilient wheel, each member disposed to move to and from the slide guide when and while an IC component is held in position by the intermittently rotated resilient wheel, each opposed processing member carried in slide guide support carried by the base, and (f) a lower receiving guide and carrier mounted on the base and adapted to accept and receive an IC carrier in which a multiplicity of like-sized processed IC components are slidably received after delivery, release and discharge of the IC component from the processing station.

2. Apparatus for processing IC components as in claim 1 in which the processing station provides for the cutting of the leads to a determined length of each IC component, said cutting provided by like cutter bars each of which is slidably carried in a slot formed in a guide support carried by the base, said slot covered by a guide plate secured to the guide support, the cutter bars being urged to and against the guide plate with the top surface of the bars establishing a cutting line of the leads and a cutting die formed as a slide guide and carried by the base, the undersurface of the cutting die cooperating with the cutter bars to shear the leads of an IC component when advanced and held by the resilient wheel during a reciprocated movement of the cutter bars.

3. Apparatus for processing IC components as in claim 2 in which the cutter bars are each urged upwardly against the associated guide plate and into the desired cutting position by spring means.

4. Apparatus for processing IC components as in claim 3 in which the spring means is compression springs with at least two springs disposed to each cutter bar and in and on the top of each spring is a ball urged into rolling contact with the undersurface of the cutter bar by the spring.

5. Apparatus for processing IC components as in claim 1 in which the upper and lower receiving carriers are retained in position on their associated guides by spring means.

6. Apparatus for processing IC components as in claim 5 in which there are appropriate stops provided with the upper and lower guides so that the carriers and the components therein are positioned in a determined relationship to the processing station and so that the released components do not escape from the carriers.

7. Apparatus for processing IC components as in claim 6 in which the springs associated with the upper and lower guides are adapted to receive U-shaped, plastic carriers and retain these carriers during the movement of the IC components from the upper to the lower carrier.

8. Apparatus for processing IC components as in claim 1 in which the pivotally mounted arm carrying the resilient wheel is held in a selected position by a bracket carried by the base and a tightening screw cooperatively engages the bracket and arm to secure the arm to the bracket.

9. Apparatus for processing IC components as in claim 1 in which the processing station provides for the straightening of the leads of each of the components when bent from a determined position, said straightening made by like straightening bars which are slidably carried in a slot formed in a guide member carried by the base, said slot covered by a guide plate secured to the guide member, the straightening bars urged to and against the guide plate to establish a plane of reciprocation and with the slide guide at the lower end of the carrier guide having inside forming shoulders toward which the straightening bars move to form the leads of the components.

10. Apparatus for processing IC components as in claim 9 in which the straightening bars are urged against the associated guide plate and into their straightening position by a plurality of springs with at least two springs disposed to each bar and in and on the top of each spring is a ball urged into rolling contact with the undersurface of the straightening bar by the spring.

11. Apparatus for processing IC components as in claim 10 in which the springs are carried in retainers mounted in the guide.

12. Apparatus for processing IC components as in claim 1 in which the processing station provides for the testing of the components by engaging the leads and passing an indicating electrical signal through the held component, the testing including test bar members each of which is slidably carried in a slot formed in a guide member carried by the base, said slot covered by a guide plate secured to and against the guide member, the test bar member being urged to and against the guide plate with the guide slot and guide plate establishing a determined plane of reciprocation, the test bar members and the slide guide associated therewith having appropriately disposed contact areas and insulation to enable the desired electrical signals to be sent at a desired time and duration.

13. Apparatus for processing IC components as in claim 1 in which the intermittent motion to the pawl and ratchet is transmitted by the pitman arm which is eccentrically mounted on an output shaft of a gear motor and from a shaft on which is mounted the ratchet, this intermittent motion transmitted by a timing belt and pulleys to a shaft on which is mounted the resilient wheel.

14. Apparatus for processing IC components as in claim 1 in which the reciprocation of the opposed processing members is achieved by rod ends eccentrically mounted on shafts carried by the base and driven by the gear motor by which the pitman arm is moved.

15. Apparatus for processing IC components as in claim 1 in which the base is a plate-like member disposed at an angle of 20° to 50° to the horizontal and when the processing includes cutting there is provided a discharge hole in and through said plate-like member, said hole disposed below the position whereat the leads are cut.

16. A method for processing the leads of like IC components which includes gravitationally feeding of like components to a processing station whereat after processing, an accumulation by gravity is provided in a collecting carrier, said method including the steps of: (a) providing and arranging a base and an upper receiving guide and carrier on said base so as to receive and retain a carrier in which a multiplicity of like-sized IC components are slidably retained for delivery from the lower end of the carrier and disposing said base and carrier at such an angle to the horizontal that the components in the carrier when mounted on the guide and carrier are delivered by gravity to said lower end of the carrier; (b) positioning a slide guide at the lower discharge end of this carrier and guide and adapting this slide guide to receive the gravitationally delivered IC components; (c) providing a processing station carried by the base and including the slide guide and positioning a resilient wheel which is carried by an arm pivotally mounted on the base so that this wheel is retained with the periphery of the resilient wheel engaging the body of an IC component when delivered to the slide guide; (d) intermittently retaining this resilient wheel by a ratchet and pawl actuated by a pitman arm and moving this arm by motor means; (e) reciprocably moving a pair of opposed processing members in a timed relationship to the movement of the resilient wheel, each opposed processing member disposed to move to and from the slide guide when and while an IC component is held in position by the intermittently rotated resilient wheel, each opposed processing member carried in a slide guide support carried by the base, and (f) carrying a lower receiving guide and carrier on the base so that said carrier is positioned to accept and receive the multiplicity of like-sized processed IC components after they are processed at the processing station.

17. The method of processing IC components as in claim 16 in which the processing station provides for the cutting of the leads to a determined length of each IC component and further includes cutting the leads by like cutter bars and carrying each bar in a slot formed in a guide support carried by the base, and covering each slot by a guide plate secured to the support, and urging the cutter bars to and against the guide plate with the top surface of the bars establishing the cutting line of the leads and positioning a cutting die so as to act as a slide guide and carrying this cutting die by the base, the undersurface of the cutting die cooperating with the cutter bars to shear the leads of an IC component when advanced and held by the resilient wheel during a reciprocated movement of the cutter bars.

18. The method of processing IC components as in claim 17 which further includes arranging the cutter bars so that each is urged upwardly against the associated guide plate and into the desired cutting position by a spring means.

19. The method of processing IC components as in claim 18 which includes forming the spring means by compression springs with at least two springs disposed to each cutter bar and positioning in and on the top of each spring a ball which is urged into rolling contact with the undersurface of the associated cutter bar by the compression spring on which the ball is mounted.

* * * * *